United States Patent [19]

Spencer

[11] Patent Number: 4,874,318
[45] Date of Patent: Oct. 17, 1989

[54] MOUNTING ARANGEMENT FOR A CHIP CARRIER

[75] Inventor: Arthur T. Spencer, Biggleswade, United Kingdom

[73] Assignee: Flexicon Systems Limited, Cambridge, United Kingdom

[21] Appl. No.: 269,740

[22] PCT Filed: Mar. 10, 1988

[86] PCT No.: PCT/GB88/00183
§ 371 Date: Nov. 2, 1988
§ 102(e) Date: Nov. 2, 1988

[87] PCT Pub. No.: WO88/07807
PCT Pub. Date: Oct. 6, 1988

[30] Foreign Application Priority Data

Mar. 31, 1987 [GB] United Kingdom ............ 8707663
May 8, 1987 [GB] United Kingdom ............ 8710951

[51] Int. Cl.⁴ .................................... H01R 23/72
[52] U.S. Cl. ............................. 439/71; 439/330; 439/364
[58] Field of Search .................. 439/68-73, 439/329, 330, 331, 362, 364, 365, 525, 526

[56] References Cited

U.S. PATENT DOCUMENTS

| 4,278,311 | 7/1981 | Scheingold et al. | 439/71 |
| 4,293,175 | 10/1981 | Cutchaw | 439/329 |
| 4,376,560 | 3/1983 | Olsson et al. | 439/331 |
| 4,420,767 | 12/1983 | Hodge et al. | 439/78 |
| 4,506,938 | 3/1985 | Madden | 439/71 |

FOREIGN PATENT DOCUMENTS 0105628 4/1984 European Pat. Off. .
2456352 8/1976 Fed. Rep. of Germany .

Primary Examiner—Neil Abrams
Attorney, Agent, or Firm—Lee & Smith

[57] ABSTRACT

An arrangement for mounting a chip (14) to a printed circuit board (10), wherein a lock nut (18) is cemented to the chip carrier to extend through an aperture (28) in a socket moulding (26) and into an aperture (30) in the pcb, the latter also receiving from the opposite direction a mounting screw (36) which screws into the lock nut to clamp the assembly together, with interface contacts (16) on the chip carrier connected to contact pads (12) on the pcb by interconnecting elements principally accommodated in slots (38) in the socket moulding.

10 Claims, 2 Drawing Sheets

MOUNTING ARANGEMENT FOR A CHIP CARRIER

FIELD OF THE INVENTION

This invention relates to an arrangement for mounting an integrated circuit chip carrier to a printed circuit board (pcb) and also to a pcb/chip carrier combination incorporating said mounting arrangement.

BACKGROUND TO THE INVENTION

In a mounting arrangement known from U.S Pat. No. 4,506,938, a socket is cemented to the pcb and receives both a contact interface member equipped with conductive interconnecting elements and the chip carrier, together with a compression spring which acts on the chip carrier to clamp the interface member between said pcb and said chip carrier with the interconnecting elements in electrical contact both with interface contacts on the chip carrier and contact pads on the pcb. In practical form the known arrangement is relatively complicated and there is risk of non-uniformly distributed clamping forces acting at the electrical interfaces.

A similar mounting arrangement is disclosed in European Patent Specification EP-B-0105628, in which an interface member is secured at each corner by a bolt to a pcb. An intergrated circuit chip carrier is then clamped against the interface member by a resilient lid which is sprung under each bolt head. Such a mounting is, in practice, similarly complicated to the above-mentioned known arrangement.

In U.S. Pat. No. 4,376,560 there is disclosed a further arrangement in which a chip carrier is clamped via an interface member to a pcb. However, in this arrangement the interconnecting elements of the interface member are permenently connected to the pcb by soldering.

It is an object of this invention to provide an improved arrangement for mounting a chip carrier to a pcb.

THE INVENTION

According to one aspect of the invention, there is provided a mounting arrangement for mounting an integrated circuit chip carrier to a printed circuit board (pcb), comprising a first fastener for fixedly attaching to the chip carrier, a socket moulding carrying interconnection elements for establishing electrical connection between interface contacts on the chip carrier and interface contact pads on the pcb, said socket moulding being apertured to receive said first fastener of the chip carrier, and a second and complementary fastener for extending through an aperture in the pcb for engagement with said first fastener to clamp the socket moulding between the chip carrier and the pcb with said interface contacts and said contact pads interconnected by said interconnection elements.

Desirably, the first fastener and the socket moulding are provided with means for orientating said insert and said moulding so that the interconnecting elements engage the chip carrier interface contacts. Preferably, moreover, the socket moulding and the pcb are provided with means for orientating said moulding and said pcb so that the interconnecting elements engage the pcb contact pads.

In one embodiment, the first fastener comprises an internally screwthreaded boss externally shaped to be received in a correspondingly shaped aperture of the socket moulding in only one angular orientation of said insert and said moulding, the second fastener comprising a mounting screw. In this embodiment, the socket moulding preferably carried one or more projecting pins to be received in one or more corresponding apertures in the pcb in only one angular orientation of said moulding and said pcb.

The invention also extends to a pcb/chip carrier combination incorporating the above-described mounting arrangement. Thus, according to another aspect of the invention, there is provided a printed circuit board/integrated circuit chip carrier combination, including a socket moulding having slots accommodating interconnecting elements which establish electrical conductive contact both with interface contacts on the chip carrier and with contact pads on the pcb, wherein the chip carrier is mounted to the pcb by means of an internally screwthreaded fastener bonded to the chip carrier and received in an aperture in said socket moulding, the latter being clamped between the pcb and the chip carrier by a mounting screw which passes through an aperture in the pcb into threaded engagement with the fastener.

If the mounting screw includes or comprises a conductive portion between the head end and the threaded shank, and the bus on the chip carrier includes a conductive element which will make contact with the conducive portion of the screw, then an electrical path will be established between the pcb and the chip carrier, when the screw is inserted. This will for example allow electrical grounding of the chip carrier to a suitable point on the pcb which may for example make contact with a conductive washer, which may be spring loaded with into contact therewith, held captive below the screw head.

Typically the screw will be of a conductive material as will also be at least the screw threaded region of the bus on the chip carrier. An elecrical connection between the conductive path of the bus (if the whole is not found from conduction material) will complete the path.

BRIEF DESCRIPTION OF DRAWINGS

The mounting arrangement in accordance with the invention will now be exemplified in the following description, making reference to the accompanying drawings, in which.

DESCRIPTION OF EMBODIMENT

Figure 1:
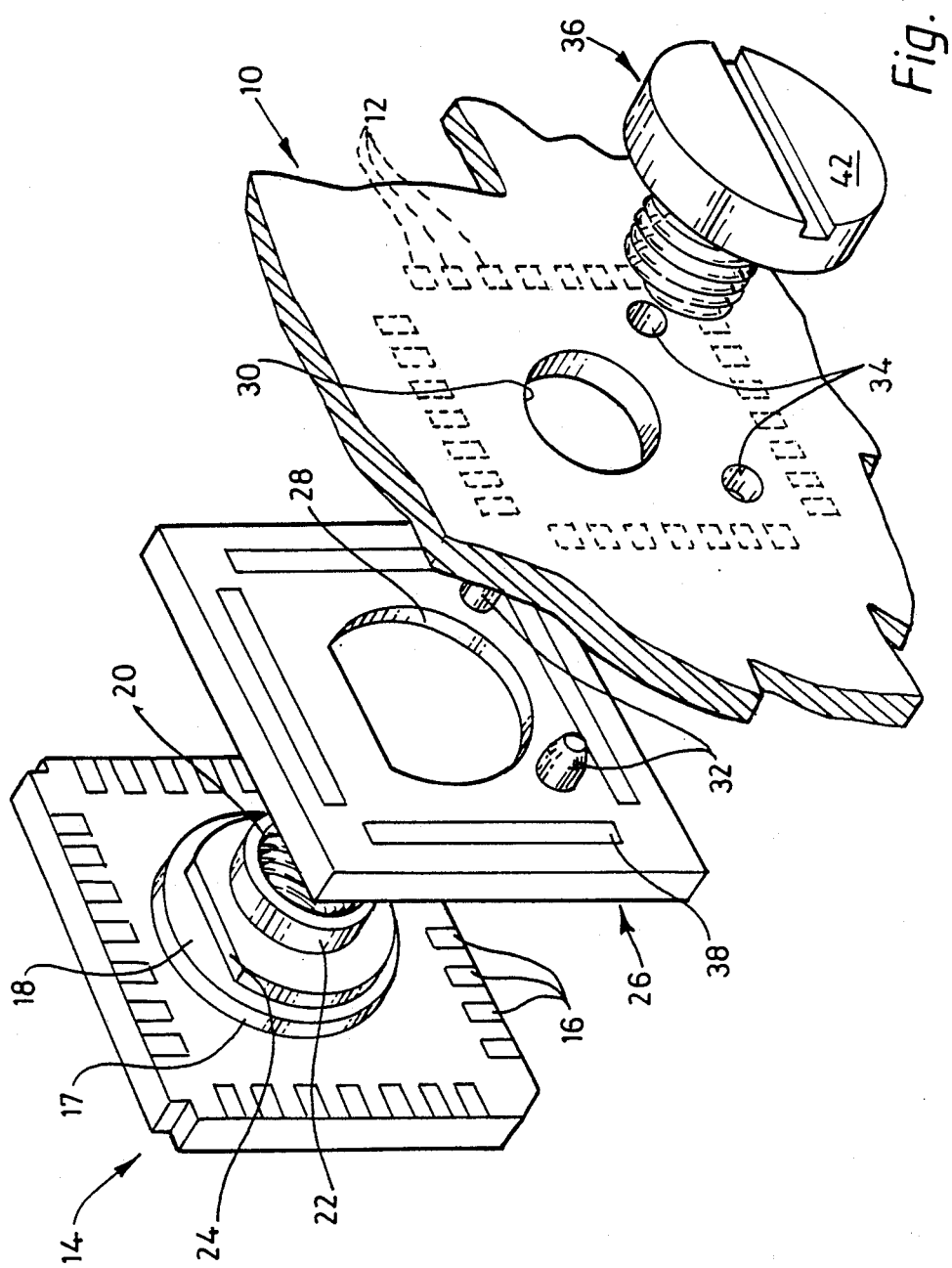
FIG. 1 is an exploded perspective view of a practical embodiment of mounting arrangement shown somewhat diagrammatically.

Referring to the drawings, a pcb 10 has on its rear face an arrangement of twenty-eight contact pads 12, positioned in a geneally square configuration with seven pads per side.

An integrated circuit chip carrier 14 has a corresponding configuration of interface contacts 16 around its square periphery. Cemented or otherwise bonded to the central region 17 of the chip carrier 14 is a mounting fastener in the form of a lock nut 18. The nut is internally threaded at 20 within a stepped projecting boss 22, the latter having a flat 24 on its external surface.

Reference 26 denotes a socket moulding having a shaped central aperture 28 for receiving the boss 22 of the lock nut 18 when the chip carrier 14 and the socket moulding 26 are in a correct angular relationship, initially determined when the lock nut 18 is bonded to the chip carrier 14.

The pcb 10 has an aperture 30 disposed centrally with respect to the contact pads 12, also receiving the boss 22 of the lock nut 18 after passage of the latter through the apertured socket moulding 26. Correct angular orientation and positioning of the socket moulding 26 with respect to the pcb 10 is achieved by means of a pair of pins 32 on the socket moulding which engage into a pair of holes 34 formed in the pcb.

The parts can be clamped together by a mounting screw 36 which passes through the aperture 30 in the pcb into threaded engagement with the nut 18. The socket moulding 26 is thus tightly sandwiched between the chip carrier 14 and the pcb 10.

The socket moulding 26 has four elongated slots 38 arranged in a square configuration which matches that of the contact pads 12 and interface contacts 16. These slots 38 accommodate elastomeric strips 40 (see FIG. 2), which each have alternate conducting and non-conducting sections of which the former constitute interconnecting elements for electrically contacting both the interface contacts 16 and the contact pads 12 in order to connect corresponding such contacts and pads together, thereby electrically to connect the i.c. chip carrier with the pcb on which the chip carrier is now mounted. The elastomeric strips 40 could be replaced by individual sprung contact elements, seven per elongated slot 38 in the socket moulding.

Figure 2:
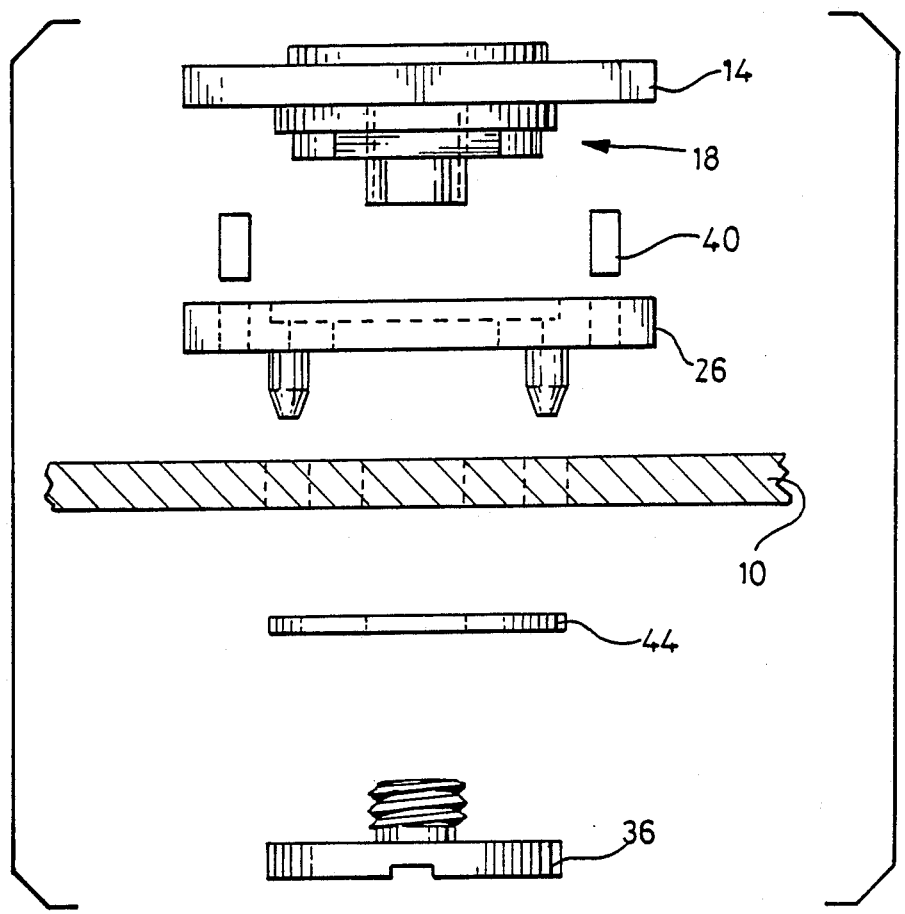
FIG. 2 is an exploded view of the mounting arrangement in side elevation.

It will be noted that the mounting screw 36 has an enlarged head 42 with a flat undersurface for ensuring an even distribution of clamping pressure at the spread electrical interfaces when the parts are assembled. An enlarged locking washer 44 may be interposed beneath the head, as shown in FIG. 2.

Figure 3:
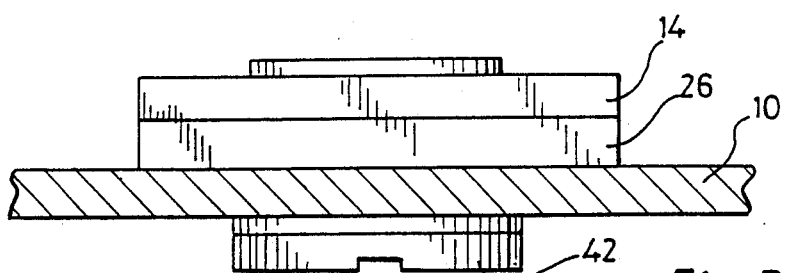
FIG. 3 is a side elevational view of an assembled pcb/chip carrier.

FIG. 3 shows the completed assembly incorporating the mounting arrangement in accordance with the invention.

The mounting arrangement as described is both simple and easily practised without the need of any special tools, as only a screwdriver or the like is required to effect assembly and dis-assembly, thus facilitating servicing and maintenance.

Although the drawing shows four elongated slots 38 in socket moulding 26, arranged parallel to the four edges, each of the slots 38 may be sub-divided if desired, for example into two aligned slots to allow pairing.

It is to be noted that screw 36 may be rendered more tamperproof by incorporating different tool engaging features in its enlarged head, and may be secured using a proprietory locking adhesive if a more permanent bond is required.

Various modifications of the above-described embodiment are possible within the scope of the invention as defined in the appended claims. For example, various means of correctly orientating the chip carrier, socket moulding and pcb contact pads may be employed instead of the means described, and in some instances it may be possible to use a common means for orientating both the socket moulding and the chip carrier with respect to the pcb.

I claim:

1. A mounting arrangement for mounting an integrated circuit chip carrier to a printed circuit board (pcb), comprising a first fastener for fixedly attaching to the chip carrier, a socket moulding carrying interconnection elements for establishing electrical connection between interface contacts on the chip carrier and interface contact pads on the pcb, said socket moulding being apertured to receive said first fastener of the chip carrier, and a second and complementary fastener for extending through an aperture in the pcb for engagement with said first fastener to clamp the socket moulding between the chip carrier and the pcb with said interface contacts and said contact pads interconnected by said interconnection elements.

2. An arrangement according to claim 1, wherein said first fastener and said socket moulding are provided with corresponding means for orientating said first fastener and said moulding so that the interconnecting elements engage the chip carrier interface contacts at the devised angular relationship.

3. An arrangement according to claim 1, wherein said socket moulding and said pcb are provided with corresponding means for orientating said moulding and said pcb so that the interconnecting elements engage the pcb contact pads at the devised angular relationship.

4. An arrangement according to claim 2, wherein said first fastener comprises an internally screwthreaded boss externally shaped to be received in a correspondingly shaped aperture of the socket moulding in only one angular orientation of said first fastener and said moulding, said second fastener comprising a mounting screw.

5. An arrangement according to claim 3, wherein the socket moulding carries at least one projecting pin to be received in a corresponding aperture in the pcb in only one angular orientation of said moulding and said pcb.

6. An arrangement according to claim 1, wherein said interconnection elements are principally accommodated in apertures in the socket moulding.

7. An arrangement according to claim 6, wherein said apertures are elongate slots each for accommodating a plurality of interconnecting elements.

8. An arrangement according to claim 7, wherein each said plurality of interconnecting elements is formed by an elastomeric strip having alternate non-conducting and conducting sections of which the latter constitute said interconnecting elements.

9. An arrangement according to claim 4, wherein said boss is dimensioned to extend at least partly through the aperture in the pcb into which the mounting screw is received, the latter having an enlarged head with a flat undersurface for pressing against the pcb around said aperture therein either directly or through an enlarged washer.

10. A printed circuit board (pcb)/integrated circuit chip carrier combination, including a socket moulding having slots accommodating interconnecting elements which establish electrical conductive contact both with interface contacts on the chip carrier and with contact pads on the pcb, wherein the chip carrier is mounted to the pcb by means of an internally screwthreaded fastener bonded to the chip carrier and received in an aperture in said socket moulding, the latter being clamped between the pcb and the chip carrier by a mounting screw which passes through an aperture in the pcb into threaded engagement with the fastener.

* * * * *